(12) United States Patent
Akutagawa et al.

(10) Patent No.: US 6,413,688 B2
(45) Date of Patent: Jul. 2, 2002

(54) PLATE PATTERN FORMING METHOD AND ITS INSPECTING METHOD

(75) Inventors: Satoshi Akutagawa; Koujiro Suzuki, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/750,694

(22) Filed: Jan. 2, 2001

(30) Foreign Application Priority Data

Jul. 12, 2000 (JP) ........................................ 2000-211448

(51) Int. Cl.⁷ .............................. G03F 9/00; G06K 9/00
(52) U.S. Cl. ......................... 430/30; 382/145; 382/149; 382/151
(58) Field of Search ............................ 430/30; 382/145, 382/149, 151

(56) References Cited

FOREIGN PATENT DOCUMENTS

| JP | 7-261372 | 10/1995 |
|----|----------|---------|

*Primary Examiner*—Christopher G. Young
(74) *Attorney, Agent, or Firm*—Staas & Halsey LLP

(57) ABSTRACT

In the method for inspecting plate patterns which are formed by exposure and development by use of exposure data patterns having a plurality of patterns, the method executes a fine pattern removal processing step, to a plurality of patterns included in the exposure data patterns, including a logical sum processing for changing a plurality of overlaid patterns into a sole pattern; a minus-sizing processing for fining a side of the patterns in a first width; and a plus-sizing processing for thickening the side of the patterns in the first width, thereby forming a reference data pattern. This fine pattern removal processing can remove the fine patterns acting as a cause of pseudo defect included in the exposure data patterns. In the following pattern inspection process, the plate pattern is compared with the reference data pattern, and the disagreement between both the patterns is detected as defective pattern. As the fine patterns acting as a cause of the pseudo defects are removed from the exposure data patterns, in the pattern inspection process, the disagreement between the plate patterns and the reference data patterns is limited to the intrinsic defective patterns, and it is possible to decrease fairly the number of steps of the pattern inspection process.

21 Claims, 12 Drawing Sheets

Superior

Defect

Superior

Pseudo
Defect

Slit Removal Processing (1)

Plus-sizing processing (S161)

OR logic processing (S162)

Down-sizing processing (S163)

Slit Removal Processing (2)

Plus-sizing processing (S161)

OR logic processing (S162)

Down-sizing processing (S163)

Fine Pattern Removal Processing (1)

OR logic processing (S201)

Minus-sizing processing (S202)

Plus-sizing processing (S203)

Fine Pattern Removal Processing (2)

↓ OR logic processing (S201)

↓ Minus-sizing processing (S202)

↓ Plus-sizing processing (S203)

Correction Pattern Reduction Processing

↓ OR logic processing (S201)

——→ Minus-sizing processing (S204)

↓ Minus-sizing processing (S202)

↓ Plus-sizing processing (S203)

→ OR logic processing (S205)

26. Reference data pattern

PLATE PATTERN FORMING METHOD AND ITS INSPECTING METHOD

BACKGROUND OF THE INVENTION

1. Field of the Invention

The present invention relates generally to a plate pattern forming method and its inspecting method in the case of forming a reticle pattern, and a mask pattern for a semiconductor device, a flat display, a magnetic device, or a device pattern, or the like (generically referred to as a plate pattern). More particularly, the present invention relates to a plate pattern forming method and its inspecting method in which a detection ratio of pseudo defects in a pattern inspection process is lowered, so that the number of steps in the inspection process is lessened.

2. Description of the Related Arts

The mask pattern is formed on a mask substrate for the semiconductor device, the flat display such as a PDP, LCD, or the like, the magnetic device, or the like, and the actual device pattern is formed on a wafer or display substrate by utilizing the mask. Various combinations depending on the fining degree exist in the method for forming the mask pattern, or device pattern.

As one example, assume that a description is made in the case of a VLSI device, based on design data in which a circuit design is ended, a layout pattern is designed by utilizing a CAD, and the CAD data are converted into exposure data, and the mask pattern is formed according to the exposure data. The process of forming this mask pattern comprises, for example, an electronic beams exposing step, a developing step, and a succeeding etching step according to the exposure data. As the results, the exposing mask which is called a reticle is formed. By utilizing this exposure mask, the device pattern is formed on a semiconductor wafer by a step and repeat method. In the future, when a fining is further advanced, it is proposed that the device pattern is drawn directly on the semiconductor wafer by an electronic beams exposure according to the exposure data. Furthermore, in a conventional versatile device, a mask substrate is formed from the reticle by the step and repeat method, and the mask substrate was closely adhered to the semiconductor wafer to expose.

In this manner, in the case where the mask pattern or device pattern (generically referred to as a plate pattern) is formed from the exposure data, a pattern inspection is necessary as to whether or not the formed plate pattern agrees with a predetermined pattern of the exposure data. In the case where the plate pattern formed in the exposing, developing, and etching steps disagrees with a pattern of the exposure data designed in the first place, it is detected as defects.

Incidentally, generically, the inspection of the plate pattern is effected with respect to the pattern formed by etching an underlayer by utilizing the resist pattern obtained by the exposure and development. However, it is possible to also effect the pattern inspection with respect to the resist pattern at a stage in which the resist is exposed and developed. Accordingly, both the plate pattern formed by the exposure, development, and etching, and the plate pattern of the resist formed by the exposure and development are objects of the plate pattern inspection of this specification. However, in the below description, the method for inspecting the plate patter which has been exposed, developed, and etched will be described as an example.

In the above pattern inspection process, in the case where an extraction pattern (slit) or a remaining pattern (fine pattern) exceeding a resolution limit in forming the plate pattern occurs in the pattern by the exposure data, a disagreement between the plate pattern after the exposing, developing, and etching steps and the pattern by the exposure data occurs. In other words, the extraction pattern (slit) or remaining pattern (fine pattern) exceeding a resolution limit vanishes from the plate pattern, and is detected as defects in the pattern inspection process. As such the extraction pattern or remaining pattern exceeding a resolution limit is not expected to be formed positively, even if such the disagreement occurs in the pattern inspection process, it is not necessary to deem such disagreement as the actual defects. However, when the plate pattern is simply compared with the pattern of the exposure data, it is detected as the defects. Then, the defects that are not required to be deemed as defects are referred to as pseudo defects.

The pseudo defects as described above were detected even in a conventional LSI manufacturing process, and do not cause any drawbacks in functions and characteristics of the device. In the case, it is confirmed whether or not the detected defective patterns are the pseudo defects, or the number of pseudo defects is reduced by dropping a defect detection sensitivity within an allowable range of a detection threshold of the defective patterns to be intrinsically detected.

However, in recent years, in the VLSI or large-sized flat display, the amount of patterns of the plate patterns reaches an enormous number, and therefore when the defective patterns detected in the patterns inspecting process are confirmed whether or not they are the above pseudo defects, such confirmation needs an enormous number of steps. Furthermore, according to the progress of fining the device, the fining patterns (extraction patterns or remaining patterns) which are unlimitedly close to a resolution limit are contained, and a difference between such the fining patterns and the fining patterns exceeding the resolution limit corresponding to the pseudo defects is lessened. As the results, when defects detection sensitivity is dropped, even the defective patterns to be intrinsically detected cannot be defected, and it becomes difficult to decrease the number of pseudo defects in a conventional method.

The fining patterns detected as the pseudo defects are formed due to various reasons. For example, they are accidentally formed in a layout design, and as the designer expects that they disappear in the developing step, they are left behind in some cases. Furthermore, a pattern processing is performed in order to eliminate fine slits which are the extraction patterns. As the results, inversely, fining patterns are newly formed in some pattern cases. Alternatively, according to the fining in recent years, in the case where correction patterns for an optical pattern correction are added to layout patterns, taking into account proximity exposure effects in the exposing step, these added correction patterns act as a cause of the pseudo defects in some cases.

SUMMARY OF THE INVENTION

It is therefore an object of the present invention to provide a plate pattern forming method and its inspection method in which the number of pseudo defects can be decreased from among pattern disagreements occurring between patterns by exposure data and plate patterns after being exposed and developed based thereon.

It is another object of the present invention to provide a plate pattern forming method and its inspection method, capable of eliminating unnecessary fining patterns from the patterns by exposure data.

In order to attain the aforesaid objects, according to a first aspect of the present invention, provided is a method of inspecting plate patterns which are formed by exposure and development by use of exposure data patterns having a plurality of patterns, the method comprising: a fine pattern removal process operation on a plurality of patterns included in the exposure data patterns, including a logical sum process to change a plurality of overlaid patterns into a sole pattern; a minus-sizing process to fine a side of the patterns in a first width; and a plus-sizing process to thicken the side of the patterns in the first width, thereby forming a reference data pattern. This fine pattern removal process can remove the fine patterns causing pseudo defects included in the exposure data patterns. In the following pattern inspect process, the plate pattern is compared with the reference data pattern, and the disagreement between both of the patterns is detected as a defective pattern. As the fine patterns causing the pseudo defects are removed from the exposure data patterns, in the pattern inspection process, the disagreement between the plate patterns and the reference data patterns is limited to the intrinsic defective patterns, and it is possible to decrease fairly the number of steps of the pattern inspection process.

According to a second aspect of the present invention, provided is a method of forming plate patterns which are formed by exposure and development by use of exposure data patterns having a plurality of patterns, the method comprising a fine slit removal process to form second exposure data patterns by, with respect to a plurality of patterns included in initial exposure data patterns, performing a plus-sizing process to thicken a side of the patterns in a first width; a logical sum process to change a plurality of overlapped patterns into a sole pattern; and a minus-sizing process to fine the side of the patterns which are processed by the logical sum process in the first width. Furthermore, the method comprises a fine pattern removal process to form third exposure data patterns by, with respect to the plurality of patterns included in the second exposure data pattern, performing a minus-sizing process fining the side of the patterns in a second width; and a plus-sizing process to thicken the side of the patterns in the second width. According to the second or third exposure data patterns, the plate patterns are formed. The inspection of the plate patterns is performed by comparing the plate patterns with the third exposure data patterns as reference patterns.

In the first fine slit removal process operation which is performed to form the plate pattern, the fine patterns may occur, but the fine patterns are removed by the next fine pattern removal process operation. Accordingly, the fine patterns causing pseudo defects are removed from the reference data patterns. As a result, in the pattern inspect process, the disagreement between the plate patterns and the reference data patterns is limited to intrinsic defective patterns, and it is possible to fairly decrease the number of operations of the pattern inspection process. Incidentally, the plate patterns may be formed by utilizing any one of the second and third exposure data patterns.

According to a third aspect of the present invention, provided is a method of forming plate patterns which are formed by exposure and development by use of exposure data patterns having a plurality of patterns, an exposure data generation operation is executed to generate initial exposure data patterns to which correction patterns corresponding to a pattern transformation in the exposing and developing operations are added. In accordance with the exposure data patterns to which these correction patterns are added, the plate patterns are formed by the exposure and development. Furthermore, a fine pattern removal process is executed to generate reference patterns by executing, with respect to the plurality of patterns included in the exposure data patterns, a logical sum process changing a plurality of overlapped patterns into a sole pattern; a minus-sizing process fining a side of the pattern in a first width; and a plus-sizing process thickening the side of the pattern in the first width. The plate patterns are inspected by utilizing the reference patterns.

Even if fine correction patterns are added while expecting the pattern transformation due to a proximity effect at the time of exposure, etc., the fine patterns are removed by the next fine pattern removal process. Accordingly, the fine patterns causing pseudo defects are removed from the reference patterns. As a result, it is possible to decrease the number of pseudo defects in the pattern inspection process.

According to a fourth aspect of the present invention, provided is a method of forming plate patterns which are formed by exposure and development by use of exposure data patterns having a plurality of patterns, an exposure data generation process is executed to generate initial exposure data patterns to which correction patterns corresponding to a pattern transformation in the exposure and development operations are added. In accordance with the exposure data patterns to which these correction patterns are added, the plate patterns are formed by the exposure and development. Furthermore, a correction pattern reduction process is executed to reduce a size of the added correction patterns with respect to the plurality of patterns included in these exposure data patterns, to generate reference patterns. The plate patterns are inspected by utilizing the reference patterns.

Even if the correction patterns in the plate patters are left behind in a reduction condition, as the correction patterns are also similarly reduced in the reference patterns to be utilized in the inspection, the pseudo defects due to the correction patterns are little detected by comparison of both.

According to a fifth aspect of the present invention, provided in a method of forming plate patterns which are formed by exposure and development by use of exposure data patterns having a plurality of patterns, a correction pattern process is executed to correct a plurality of patterns included in initial exposure data patterns corresponding to a pattern transformation in the exposure and development steps. In accordance with second exposure data patterns generated by this correction pattern processing, the plate patterns are formed. The plate patterns are inspected while utilizing the second exposure data as the reference pattern. On the other hand, a differential extraction process is executed to extract a difference between the initial exposure data patterns and the second exposure data patterns. The data at a position of a differential pattern extracted in the differential extraction process is removed as pseudo defects data from defective data detected by the plate pattern inspection process.

The fine patterns causing the pseudo defects caused by the correction pattern process, in many cases, exist at a position of the differential pattern between the first exposure data patterns and the second exposure data patterns (or reference patterns). Therefore, the data at the position of the differential pattern is removed from the defective data detected in the inspection operation, so that many pseudo defects can be eliminated.

DESCRIPTION OF THE PREFERRED EMBODIMENTS

Hereinafter, an embodiment of the present invention will be explained with reference to the drawings. However, such the embodiment is not limited to a technical scope of the present invention.

FIG. 1 is a diagram explaining pseudo defects. FIGS. 1A and 1B show the case where two patterns E1, E2 are confronted with each other via a gap d1 larger than a resolution limit. A dashed line shows a pattern by exposure data, and a solid line shows a plate pattern which is exposed by the exposure data, developed, and etched, respectively. As the gap d1 is larger than the resolution limit, a layout designer intentionally forms this gap d1, and it is requested that the plate pattern (solid line) after exposed and developed, and etched further maintains the gap.

Figure 1A:
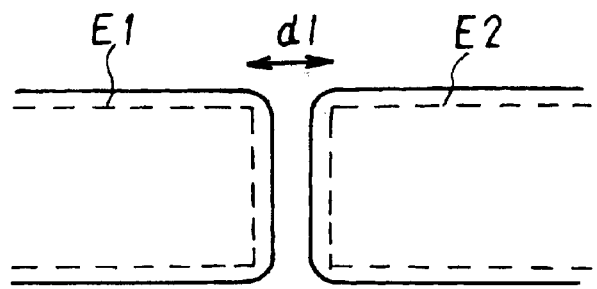
FIG. 1 is a diagram explaining pseudo defects.
Figure 1B:
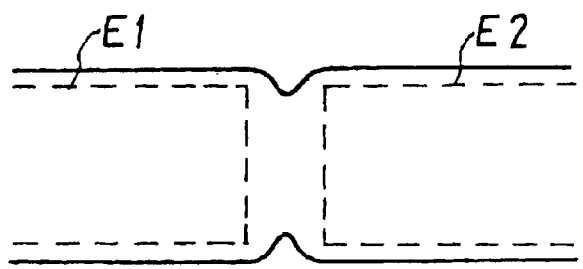

In the case, in FIG. 1A, as in the plate pattern in a solid line, a gap exists at a position of d1, the plate pattern is judged as a superior one in an inspection operation. However, in FIG. 1B, as in the plate pattern in the solid line, the gap disappears, it is judged as defects in the inspection operation.

Figure 1C:
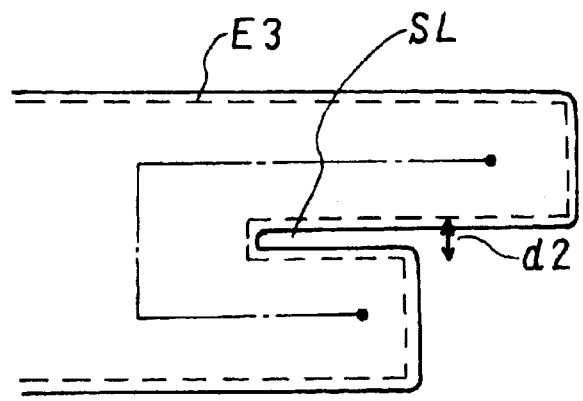
Figure 1D:
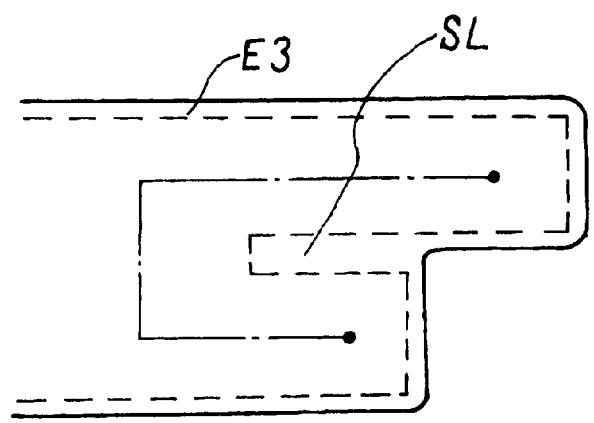

On the other hand, FIGS. 1C and 1D show the case where a pattern E3 has a smaller slip SL than a resolution limit. This pattern E3 is, for example, a wiring pattern formed by giving a fixed width to a wiring path indicated by a one-dot chain line in the drawing. When in a layout design, the wiring pattern E3 is formed by giving a fixed width to the wiring path, in some cases, the slit SL is generated which does not need to exist in functions of a device. Such a slit SL is smaller than the resolution limit, and does not necessarily need to be left behind after being exposed, developed, and etched. In other words, the slit SL may be left behind in the plate pattern in the solid line, or may not be left behind therein.

In the case, as shown in FIG. 1C, where the plate pattern in the solid line has the slit SL, it is judged as a superior one in the inspection operation of comparing it with the exposure data pattern in a dashed line. On the other hand, as shown in FIG. 1D, in the case where the slit vanishes from the plate pattern in the solid line, as there is a disagreement with the exposure data pattern in the dashed line in the inspection operation, it is detected as defects. However, as described above, as the slip SL may vanish in functions of the device, these defects are pseudo defects which have no problems realistically. In the conventional plate pattern inspection process, it is necessary to distinguish these pseudo defects from the realistic defects, and the working steps are enormous. as shown in FIG. 1D, in the case where the slit vanishes from the plate pattern in the solid line, as there is a disagreement with the exposure data pattern in the dashed line in the inspection step, it is detected as defects. However, as described above, as the slip SL may vanish in functions of the device, these defects are pseudo defects which have no problems realistically. In the conventional plate pattern inspection process, it is necessary to distinguish these pseudo defects from the realistic defects, and the working steps are enormous.

The fine pattern acting as a cause of the pseudo defects contains a fine line pattern in addition to the fine slit. For example, as fine line patterns MP2, MP3, shown in FIG. 7 to be described below, vanish as the results of the exposure, development, and etching, too, in some cases, the pseudo defects may occur in the pattern inspection in comparison with the exposure data pattern.

Figure 2:
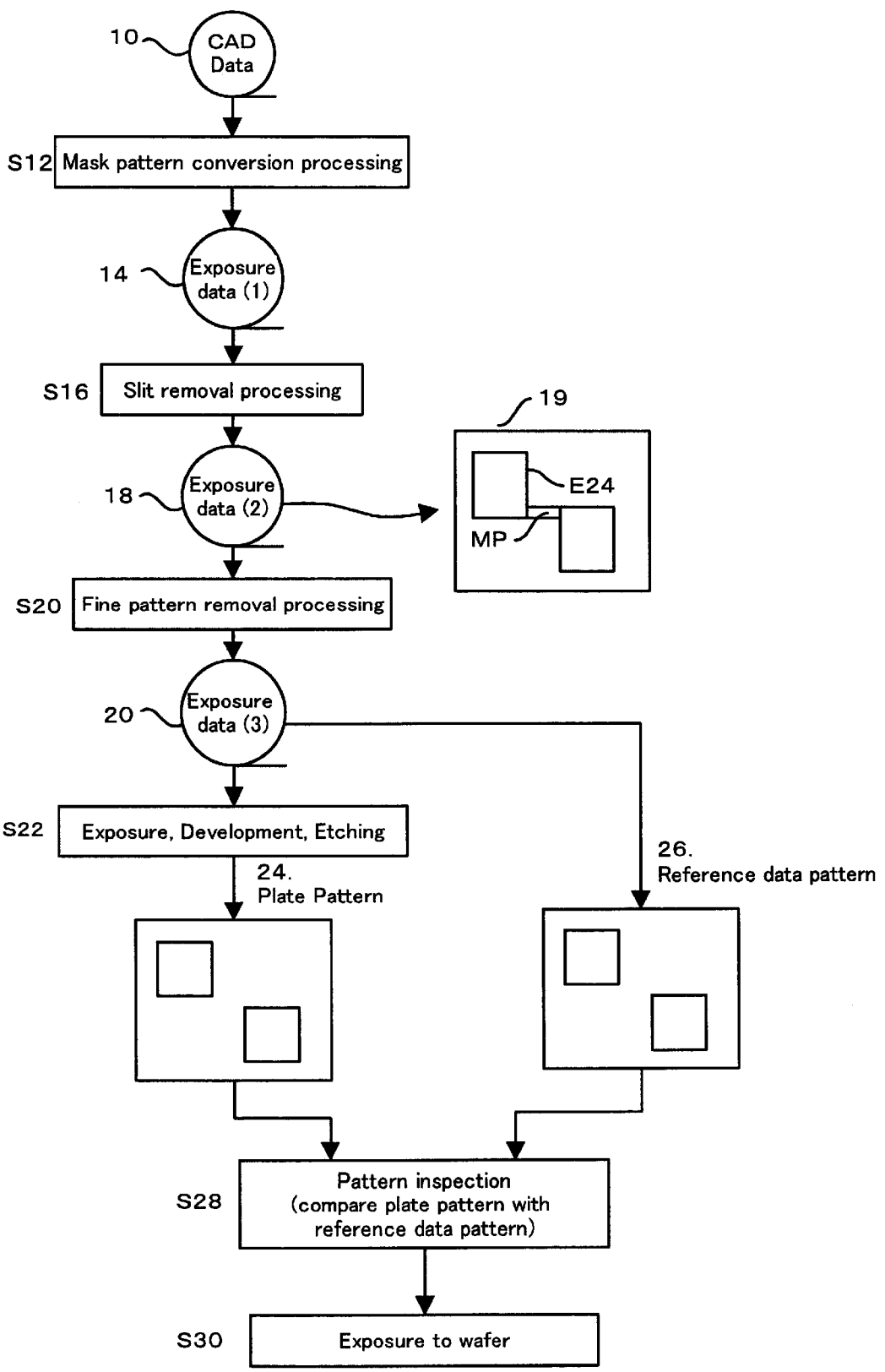
FIG. 2 is a flowchart showing a method of forming and inspecting plate patterns according to a first embodiment.

FIG. 2 is a flowchart showing a method of forming and inspecting the plate pattern according to a first embodiment. Herein, the embodiment will be explained in an example that the plate pattern is a reticle pattern. When a logic design of an LSI device is completed, the layout design is performed by utilizing a computer. As the results of the layout design, CAD data 10 of a GDSII format, for example, is formed. These CAD data 10 are a kind of vector data, and are converted into exposure data 14 by a mask pattern conversion processing S12. The exposure data 14 are, for example, MEBES exposure data (MEBES is a name of an exposure apparatus), and have origin coordinates, widths, and heights of the patterns, and are also data which can specify a pattern form, and are a data format adapted for the exposure apparatus.

In some cases, the exposure data 14 formed by this layout design contain patterns having a slit shown in FIG. 1. Such a slit smaller than the resolution limit acts to cause pseudo defects. Then, as shown in FIG. 2, a slit removal processing S16 is performed with respect to the exposure data 14, to form second exposure data 18.

FIG. 3 is a diagram explaining a slit removal process. As shown in FIG. 3A, assume that two patterns E10, E12 are disposed across the slit SL. This example is analogous to FIGS. 1C and 1D, and differs in that the exposure data are constituted by the two patterns. The slit SL is not necessarily needed in the operation of the device, and is smaller than the resolution limit.

Figure 3A:
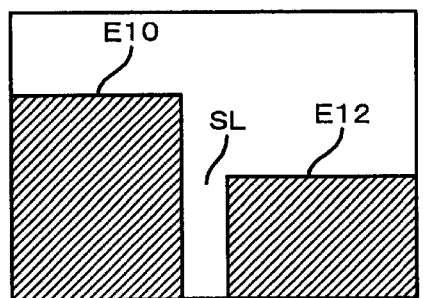
FIG. 3 is a diagram explaining a slit removal processing.
Figure 3B:
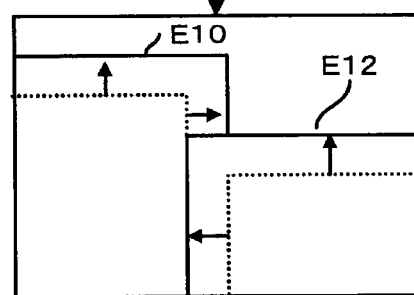

In the slit removal process of FIG. 3, first, a plus-sizing process S161 to thicken each pattern is performed to form the patterns E10, E12 in a solid line in which patterns in a dashed line are overlaid on each other, as shown in FIG. 3B. As a result, the slit SL existing between the original patterns E12 and E2 is buried. In other words, in the plus-sizing process S161, a process is performed to thicken the patterns E10, E12 only in a width of ½ width or more of the slit SL which is smaller than the resolution limit. Then, an OR logic (logical-sum) processing S162 is performed to remove overlapping of the overlapping patterns to form a sole pattern E14. As a result, the exposure data becomes data composed of the one pattern E14 of FIG. 3C from the data composed of the two patterns E10, E12.

In general, in the exposure data, a polygon comprising tens to hundreds of apexes can be defined as one pattern.

Accordingly, if within a range of the number of apexes, it is possible to change a plurality of overlapped patterns into a single pattern by the plus-sizing.

Figure 3C:
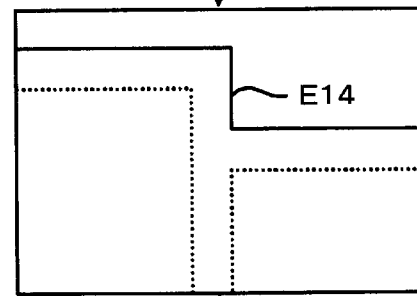
Figure 3D:
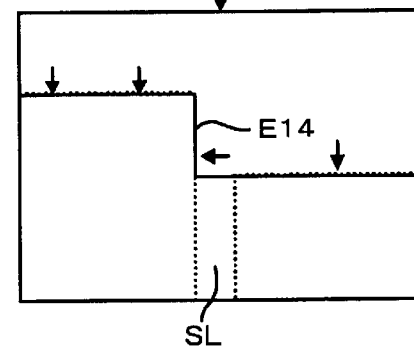

When a downsizing processing S163 is performed to fine a pattern with respect to the pattern E14 of FIG. 3C, each side of the pattern E14 is retreated to obtain the pattern E14 removing the slit SL between the two patterns E10 and E12 of FIG. 3A. It is preferable that a width of this downsizing processing is the same as the one of the plus-sizing processing. Then, the pattern E14 is the same pattern as the original patterns E10, E12, but burying the slit SL.

In the plus-sizing processing and downsizing processing, the pattern is thickened or fined only by a predetermined width smaller than the resolution limit of the exposure, development, and etching. Thereby, the unnecessary slit SL causing the pseudo defects can be removed, and also some slits which are larger than the resolution limit and are not permitted to be removed, can be left behind.

Returning to FIG. 2 as a result of performing the slit removal process S16 shown in FIG. 3, the second exposure data 18 is formed. However, the fine patterns causing the pseudo defects, in some cases, may be formed in these second exposure data 18 in another position, as a result of the slit removal process. Then, in FIG. 2, a fine pattern removal process S20 is performed for the second exposure data 18 to form third exposure data 20. cause of the pseudo defects, in some cases, may be formed in these second exposure data 18 in another position, as the results of the slit removal processing. Then, in FIG. 2, a fine pattern removal processing S20 is performed for the second exposure data 18 to form third exposure data 20.

FIG. 4 is a diagram showing drawbacks of the slit removal process. In the example of FIG. 4, as shown in FIG. 4A, two rectangular patterns E20, E22 are disposed so as to slide in a vertical direction across the slit SL. In the case where such patterns exist, when the slit removal process shown in FIG. 3 is performed, the slit is buried, but inversely, this accompanies a secondary effect where the fine patterns are formed which will cause pseudo defects.

Figure 4A:
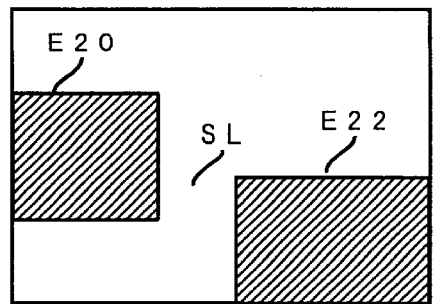
FIG. 4 is a diagram showing drawbacks of the slit removal processing.
Figure 4B:
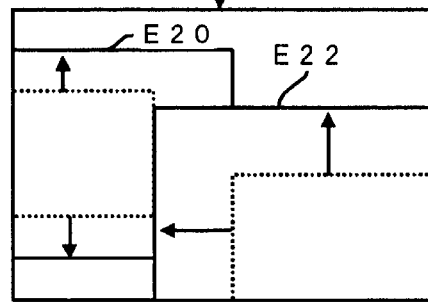
Figure 4C:
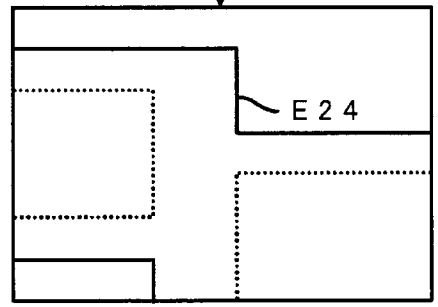
Figure 4D:
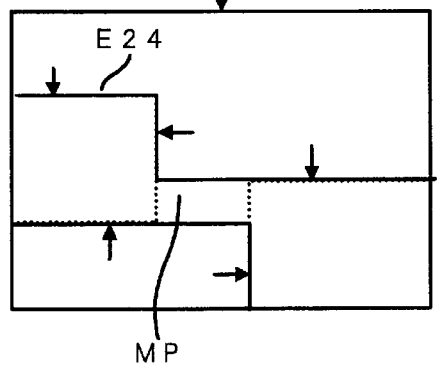

In a condition of FIG. 4A, when the plus-sizing process S161 is performed on a width of the slit SL, both the patterns E20, E22 are thickened, and overlap on a part of the slit SL therebetween as shown in FIG. 4B. Then, when the OR logic process S162 is performed, the two overlapped patterns E20, E22 are converted into a single pattern E24. In other words, the overlapping is removed, and they are defined as the sole pattern E24. Then, the downsizing processing S163 with the width of the slit SL is performed, so that a side of the pattern E24 is retreated and fined. As the results, as shown in FIG. 4D, a fine pattern MP is formed newly.

In the case where the fine pattern MP has the line width smaller than the resolution limit, in some cases, such a fine pattern MP does not exist in the plate patterns to be formed by the exposure and development. As a result, when utilizing the second exposure data 18 to which the slit removal processing is performed, a reticle pattern is formed by the exposure, development, and etching, and a part of the fine pattern MP is detected as pseudo defects in the plate pattern inspection process. In other words, as the results of performing the process S16 to remove the slits which cause the pseudo defects, as shown in reference numeral 19 in FIG. 2, another fine pattern MP is formed causing the pseudo defects.

Figure 5A:
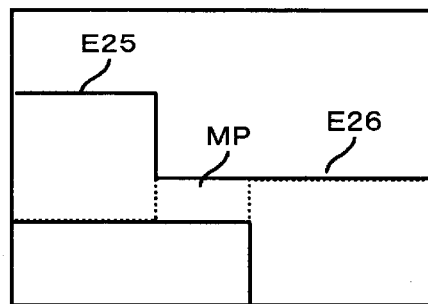
FIG. 5 is a diagram explaining a fine patterns removal processing.

Then, as shown in FIG. 2, according to this embodiment, the fine pattern removal process S20 is performed with respect to the second exposure data 18. FIG. 5 is a diagram explaining the fine pattern removal process. FIG. 5A shows a pattern of FIG. 4D. Assume that, as shown in FIG. 5A, the patterns are constituted by separate patterns E25, E26, MP, first, an OR logic (logical-sum) processing S201 is performed, and a single pattern E24 is reestablished. However, in the case where the sole pattern E24, as shown in FIG. 4C has been already reestablished by the OR logic processing S162 in the slit removal process of FIG. 4, the OR logic processing S201 in FIG. 5 is unnecessary.

Figure 5B:
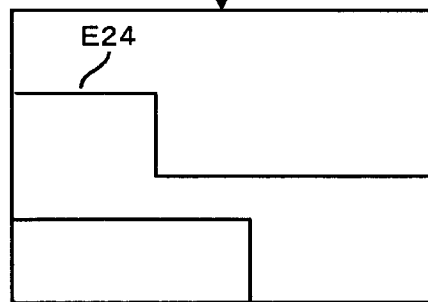
Figure 5C:
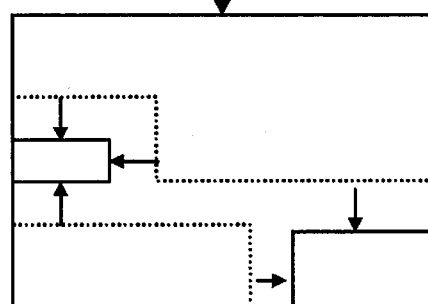
Figure 5D:
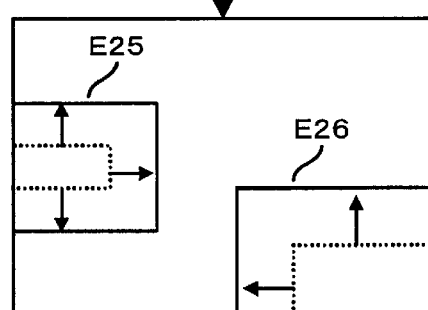

Next, in the single pattern E24 shown in FIG. 5B, a minus-sizing process S202 is performed only with a line width of the fine pattern MP to erase the fine pattern MP shown in FIG. 5C. Thereafter, a plus-sizing process S203 is performed only by the same width to return to two patterns E25, E26 excluding the fine pattern MP, as shown in FIG. 5D. These patterns of FIG. 5D are same as those of FIG. 4A. It is necessary that the line width of the minus-sizing processing and plus-sizing processing is a line width equal to or more than the fine pattern MP which is smaller than the resolution limit, and a line width to such a degree that the fine patterns larger than the resolution limit are not removed. Thus, the intrinsically necessary fine patterns are not erased, but the unnecessary fine patterns causing the pseudo defects disappear.

Return to FIG. 2, the fine patterns MP causing the pseudo defects are instead formed by the slit removal process S16 with respect to the patterns as shown in FIG. 4A, but the fine patterns MP are removed by the fine pattern removal process S20 to return to the original patterns. Then, an exposure, development, and etching S22 are performed by utilizing the third exposure data 20 in which the fine patterns are removed, so that a plate pattern 24 is formed on a reticle substrate.

On the other hand, in a pattern inspection process S28, the actual formed plate patterns 24 are compared with the exposure data 20 used in the formation of the plate patterns as reference data patterns 26. According to the embodiment of FIG. 2, as the fine slits and patterns of the resolution limit or less causing the pseudo defects are removed from the reference data patterns 26, the substantially same reference data patterns 26 as the plate patterns 24 formed actually by the exposure, development, and etching are utilized, so that the number of conventional pseudo defects is fairly decreased. When they are judged as superior ones in the pattern inspection process S28, the patterns of the reticle are exposed to a semiconductor wafer by a step and repeat method (S30).

Figure 6:
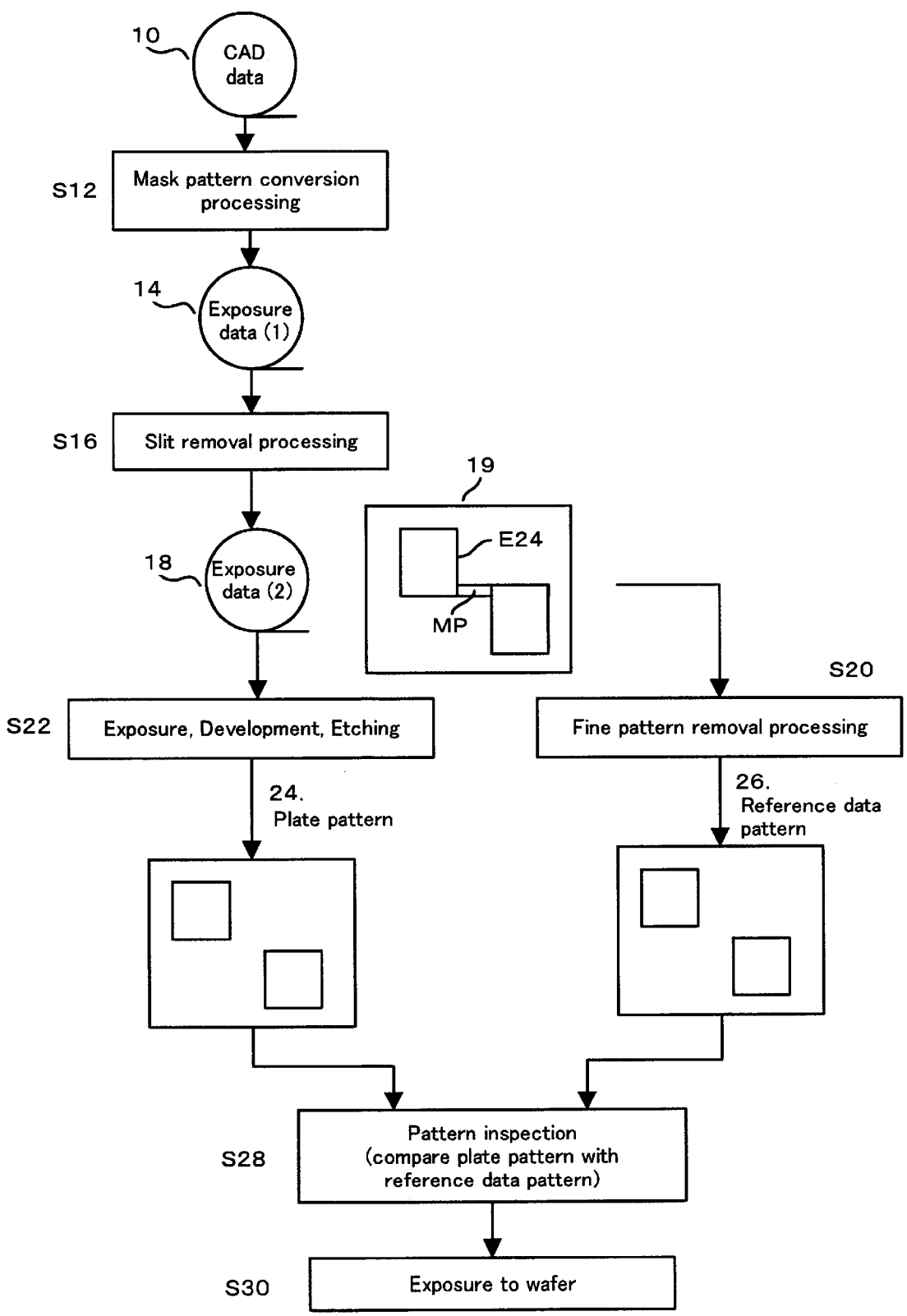
FIG. 6 is a flowchart of a modification example according to the first embodiment.

FIG. 6 is a flowchart of a modified example according to the first embodiment. In the flowchart of FIG. 2, the plate pattern 24 is formed by utilizing the third exposure data 20 obtained by performing the slit removal process S16 and the fine pattern removal process S20 on the first exposure data 14. In contrast, in the example of FIG. 6, the exposure, development, and etching are performed by use of the second exposure data 18 obtained by performing the slit removal process S16 on the first exposure data 14, to form the plate patterns 24. The reasons are that the fine patterns MP smaller than the resolution limit are not formed by the exposure, development, and etching even without performing the fine patterns removal process.

However, the reference data patterns 26 in use for a patterns inspection are required to be data which are close to the real plate patterns 24 as much as possible. Accordingly, in the example of FIG. 6, the fine pattern removal process S20 is performed on the second exposure data 18 so as to form the inspecting reference data patterns 26. The fine pattern removal processing S20 is as explained in FIG. 5. As a result, the inspecting reference data patterns 26 are ones close to the plate patterns 24 by excluding the fine patterns MP smaller than the resolution limit. Accordingly, in the pattern inspection process S28, it is possible to decrease a detection amount of the pseudo defects caused by the fine patterns MP.

Figure 7A:
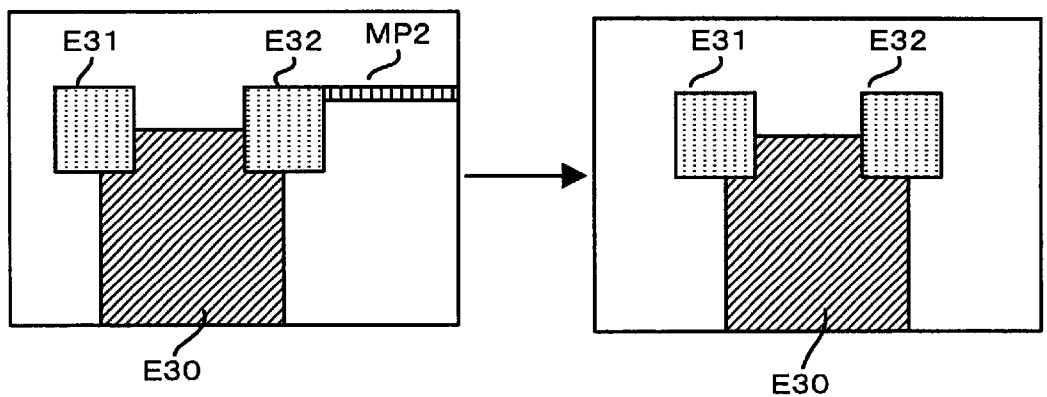
FIG. 7 is a diagram showing a patterns example of exposure data containing the fine patterns acting as a cause of the pseudo defects.
Figure 7B:
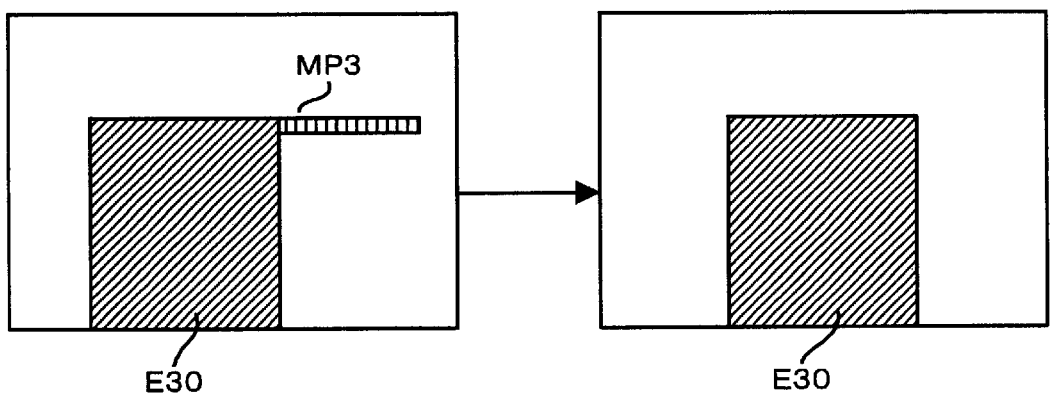

FIG. 7 is a diagram showing a pattern example of exposure data containing fine patterns which act as a cause of the pseudo defects. FIG. 7A is an example in which correction patterns E31, E32 are added to a normal pattern E30 by OPC (Optical Pattern Correction) correction as described later. In this case, fine patterns MP2 may be annexed thereto by some factor in the slit removal process S16 of FIG. 6. The fine patterns MP2 are not formed due to the resolution limit in the steps of exposure, development, and etching to form the real plate pattern, to become a plate pattern on the right side. FIG. 7B is another example, and fine patterns MP3 have been yet formed in the normal patterns S30 by any processing such as the slit removal processing S16, or the like. In this case also, the fine patterns MP3 are not exposed and developed, and the plate pattern is formed as shown in a plate pattern at the right side, therefore, the pseudo defects are detected in the pattern inspection process.

The unexpected fine patterns MP as shown in FIG. 7 may be included in the exposure data patterns. In this case, the exposure and development are performed by utilizing the third exposure data 20 obtained by executing the fine patterns removal process S20 shown in FIG. 2, and the third exposure data are utilized as the reference data patterns for a mask inspection. Then, it is possible to decrease the pseudo defects attributable to the fine patterns MP. It is also possible to decrease the pseudo defects similarly in the method shown in FIG. 6.

Figure 8:
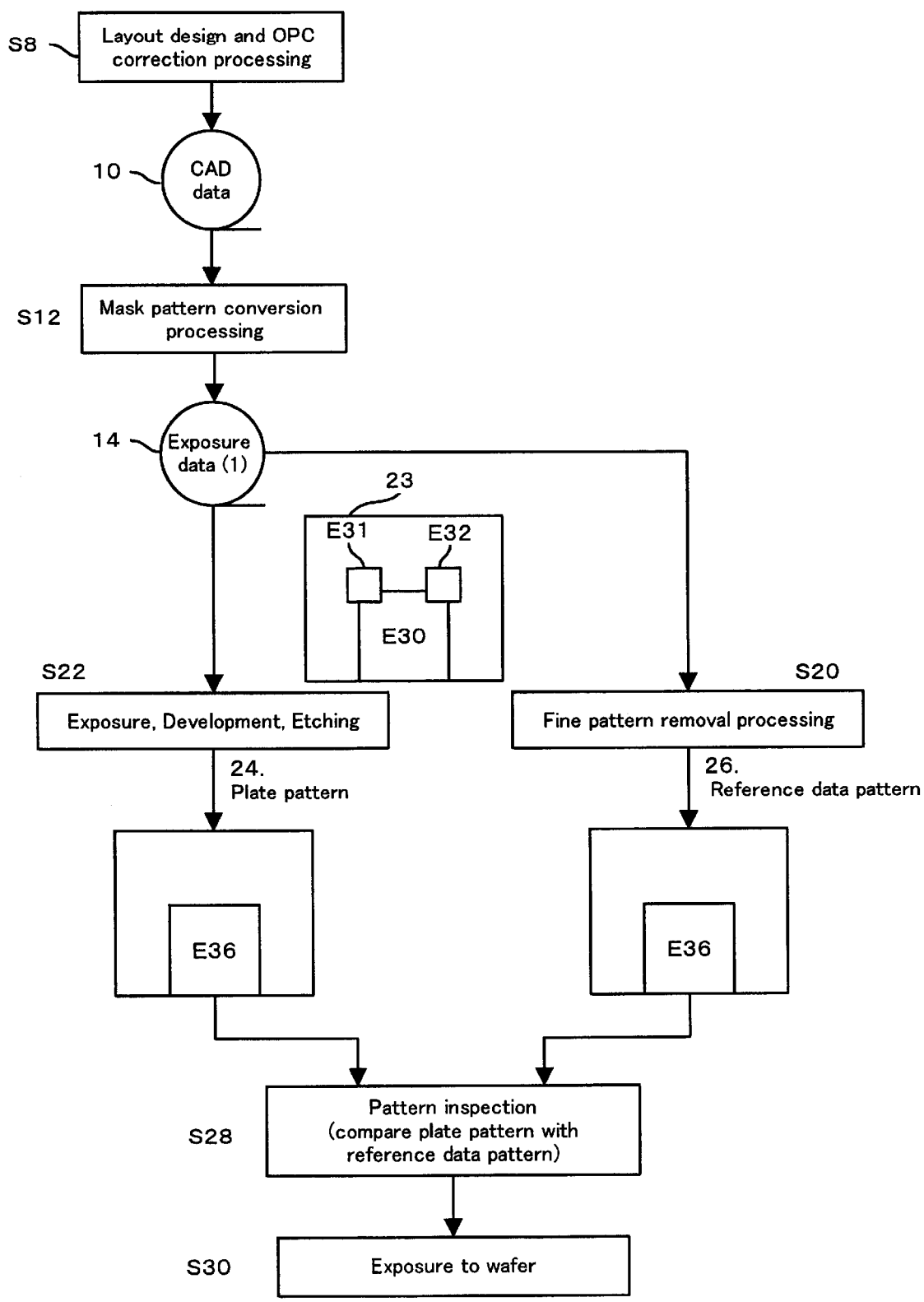
FIG. 8 is a flowchart showing a method of forming the plate patterns according to a second embodiment.

FIG. 8 is a flowchart of a method of forming a plate pattern according to a second embodiment. In the case where the plate pattern on a reticle is formed by an electronic beams exposure by utilizing exposure data, the same plate patterns as the patterns of the exposure data are not necessarily formed due to proximity exposure effects. As described above, if the plate patterns are fine patterns of the resolution limit or less, a light exposure is insufficient to develop in many cases. Furthermore, angular parts of rectangular patterns are rounded in the real plate patterns. Additionally, pattern transformation occurs in response to roughness and fineness between the patterns due to the proximity exposure effects.

Such pattern transformation was in the sufficiently allowable range relative to a pattern dimension in the prior art, but in recent years, the pattern transformation amount is in the unallowable range due to the fine pattern dimension. In order to improve such the pattern transformation, correction patterns offsetting the pattern transformation are added to the patterns of the exposure data beforehand, or the exposure data patterns are transformed therefore. For example, in patterns 23 shown at a left side of the exposure data 14 of FIG. 8, the correction patterns E31, E32 are added to both angular parts of the original rectangular patterns E30, and the angular part of the plate patterns 24 is prevented from being rounded. Such a correction is called an OPC correction.

In many cases, in general, the designer intentionally makes the aforesaid OPC correction at the stage of a layout design. Namely, as shown in step S8 of FIG. 8, in the layout design process based on logic design data, the OPC correction patterns are simultaneously added thereto. The reasons are that if the formation of the mask patterns and the pattern correction are made in the same process as the layout design, the pattern generation process can efficiently be performed taking into account pattern characteristic information or the like included in the design data. Accordingly, the correction patterns E31, E32 are added to the CAD data 10 generated by the layout design, as already shown in the patterns 23. The CAD data 10 are converted into a format which can be used in the exposure step by an exposure apparatus, by a normal mask pattern conversion processing. The correction patterns E31, E32 are added in the converted exposure data 14 as in the patterns 23, too.

However, the plate patterns 24 are formed by an exposure, development, and etching step S22 by utilizing the exposure data 14, and the correction patterns are not formed therein, and the original rectangular patterns E36 are formed in a condition that the angular part is sharpened. Accordingly, according to this embodiment, the fine pattern removal process S20 is performed with respect to the patterns of the exposure data 14, whereby the correction patterns E31, E32 are deleted so as to form the inspecting reference data patterns 26 which are close to the plate patterns 24 as much as possible.

FIG. 9 is a diagram showing the fine pattern removal process with respect to the exposure data to which the correction patterns are added. FIG. 9A shows an example of the patterns 23. Namely, the correction patterns E31, E32 are added to the angular part of the original rectangular patterns E30 to prevent the angular part from round transforming due to the proximity exposure effects or the like.

Figure 9A:
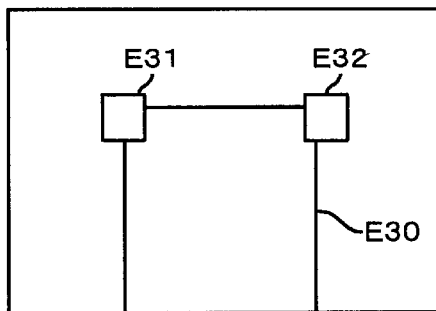
FIG. 9 is a diagram showing the fine patterns removal processing with respect to exposure data to which correction patterns are added.
Figure 9B:
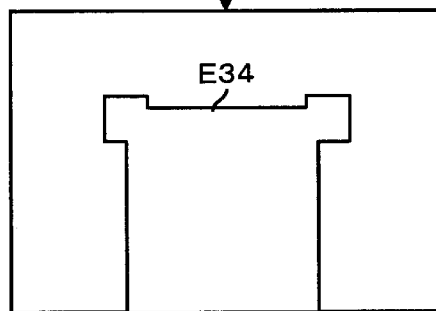
Figure 9C:
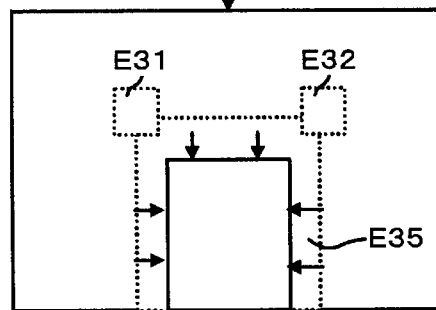

The OR logic process S201 is executed to eliminate the overlapped part and make a single pattern E34 with respect to the corrected exposure data patterns. As a result, as shown in FIG. 9B, the three patterns E30, E31, E32 are changed to the single pattern E34. The minus-sizing process S202 of a predetermined width is performed, whereby each side of the patterns E34 is fined by a predetermined width, as shown in FIG. 9C. In the process, the correction patterns E31, E32 vanish. In order to vanish the correction patterns E31, E32, the minus-sizing larger than a width of the correction patterns has to be performed. In the minus-sizing process, a fining amount is controlled to be less than a predetermined value so as not to vanish the normal patterns.

Figure 9D:
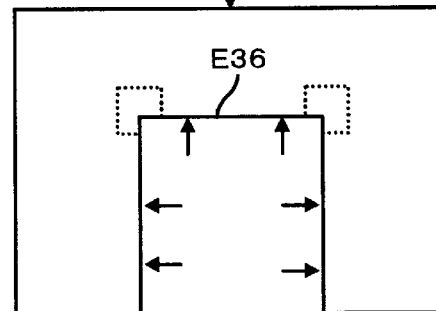

A plus-sizing process S203 is performed in the same width with respect to fined patterns E35, and as shown in FIG. 9D, patterns E36 are analogous to the plate patterns 24 in which the correction patterns do not exist at the angular part, and such patterns E36 are formed. The patterns are utilized as the reference data patterns 26 in the pattern inspection process, as shown in FIG. 8. Accordingly, in the pattern inspection process S28, the pseudo defects attributable to the correction patterns are not be detected.

Figure 10:
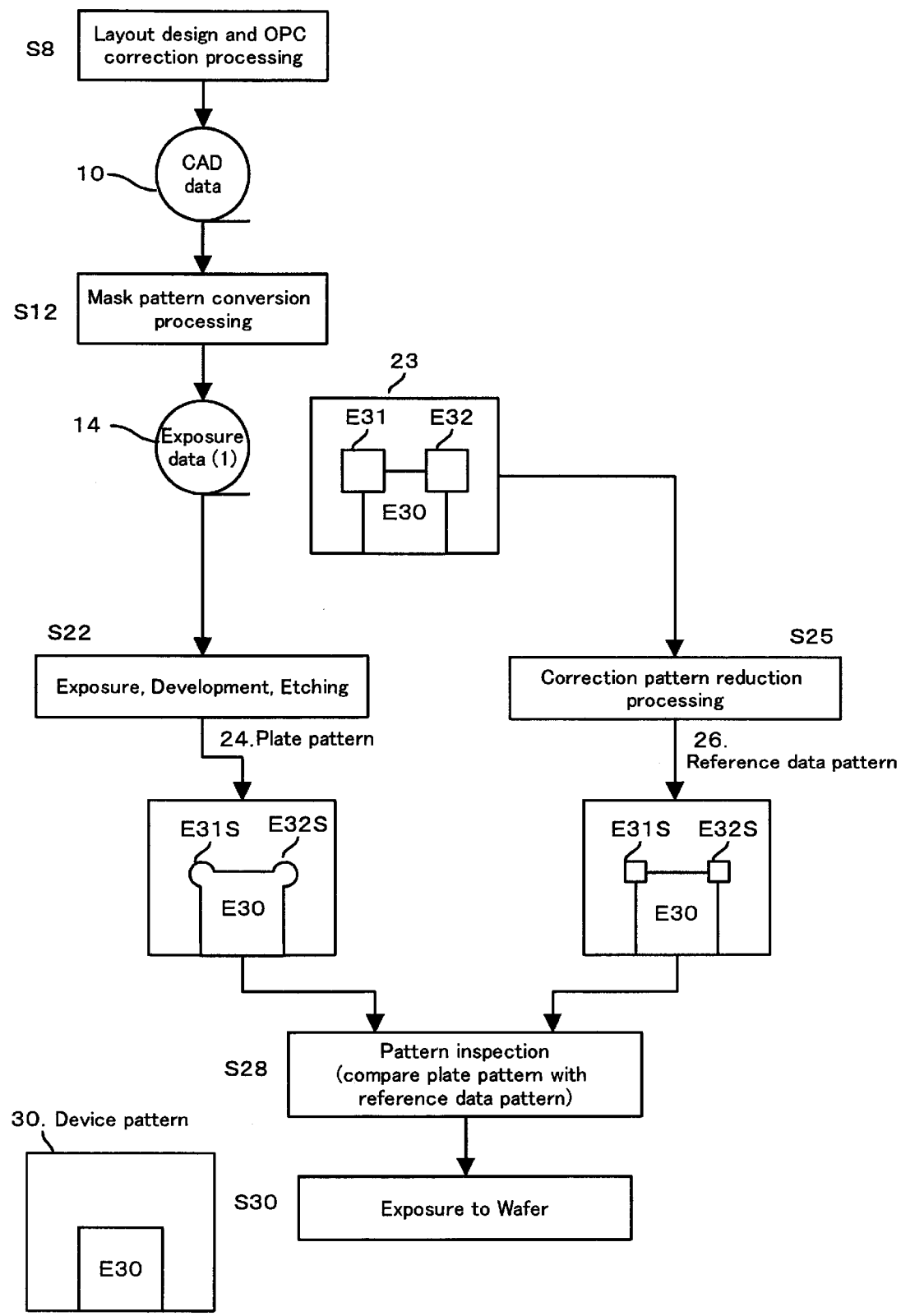
FIG. 10 is a flowchart showing a method of forming the plate patterns according to a third embodiment.

FIG. 10 is a flowchart of a method of forming the plate patterns according to a third embodiment. The same reference numbers are given to the same steps as in FIG. 8. In the example of FIG. 10, the correction patterns E31, E32 are formed taking into account both of a pattern transformation which occurs when the plate patterns 24 are formed on the reticle from the exposure data 14; and a pattern transformation which occurs when the patterns are formed on the wafer by utilizing the reticle. Accordingly, the correction patterns E31, E32 are disposed at the angular part of the original rectangular patterns E30, and the size is greater than the case of FIG. 8.

Accordingly, in the plate patterns 24 formed by the exposure, development, and etching process S22, due to the exposure data 14 to which the correction patterns E31, E32 are added, correction patterns E31S, E32S reduced and rounded are still left behind at the angular part of the original patterns E30. By utilizing the reticle having the plate patterns 24, the exposure, development, and etching are performed by the step and repeat method, so that the correction patterns E31S, E32S vanish in the device patterns 30, and the angular part of the device patterns 30 is formed as the sharp patterns E30.

In this manner, the fine patterns such as the correction patterns, etc. are rounded and reduced as a whole after the exposure, development, and etching process. The angular parts of the patterns are apt to round in the same manner. In contrast thereto, a long side of the large patterns can be formed to be plate patterns of the substantially same shape as the exposure data patterns by control of the light exposure, etc. Accordingly, in this manner, in the exposure data patterns 23, the correction patterns E31, E32 are formed at the angular part of the patterns E30, and the plate patterns 24 of the reticle is formed to have any but reduced correction patterns E31S, E32S. Even if the exposure, development, and etching on the wafer are further performed, the angular parts of the patterns E30 are not rounded due to existence of the correction patterns, and such the sharp patterns can be formed.

According to this embodiment, in order to make the reference data patterns 26 used in a patterns inspection S28 close to the plate patterns 24 as much as possible, a correction pattern reduction processing S25 is performed to the exposure data 14. As the results, in the reference data patterns 26 also, the reduced correction patterns E31S, E32S are formed at the angular parts of the original patterns E30. Accordingly, when the pattern inspection S28 is performed by utilizing the reference data patterns 26, it is possible to decrease an amount of pseudo defects attributable to the correction patterns.

FIG. 11 is a diagram explaining the correction patterns reduction process. In FIG. 11A, an example of the patterns 23 of FIG. 10 is shown. Namely, the correction patterns E31, E32 are added to the angular parts of the original rectangular patterns E30 to prevent the angular part from round transforming due to the proximity exposure effects, etc.

Figure 11A:
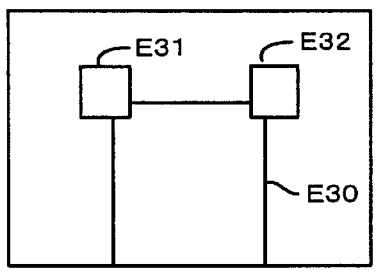
FIG. 11 is a diagram explaining a correction patterns reduction processing.
Figure 11B:
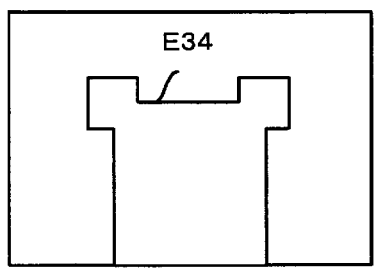
Figure 11E:
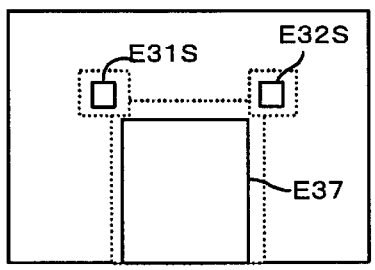
Figure 11C:
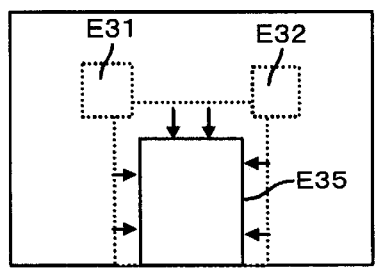
Figure 11D:
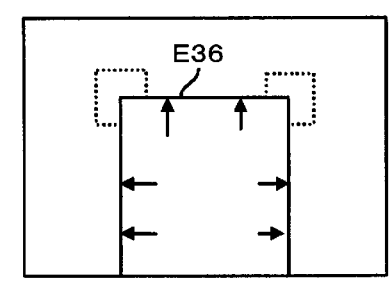

Respective processes of FIGS. 11A, 11B, 11C, and 11D are same as in the process of FIG. 9. Namely, the OR logic process S201 is executed to change the corrected exposure data patterns in FIG. 11A into the single pattern E34 by eliminating the overlapped part. As a result, as shown in FIG. 11B, the three patterns E30, E31, E32 are changed to the single pattern E34. The minus-sizing process S202 in a predetermined width is performed, whereby each side of the patterns E34 is fined in a predetermined width, as shown in FIG. 11C. In the process, the correction patterns E31, E32 vanish. In order to vanish the correction patterns E31, E32, the minus-sizing larger than a width of the correction patterns may be performed. In the minus-sizing process S202, a fining amount is controlled to be less than a predetermined value so as not to vanish the normal patterns. The plus-sizing process S203 is performed in the same width with respect to the fined patterns E35, so that patterns E36 are analogous to the plate patterns 24 in which the correction patterns do not exist at the angular part, and such the patterns E36 are formed, as shown in FIG. 11D.

On the other hand, a minus-sizing process S204 is performed in a predetermined width with respect to the three patterns E30, E31, E32 of FIG. 11A to such a degree that the correction patterns E31, E32 do not vanish. As a result, the correction patterns at the angular part become the patterns E31D, E32S reduced as shown in FIG. 11E. Furthermore, the original patterns E30 are also reduced as in patterns E37. Then, the OR logic process S205 is performed for the patterns of FIG. 11D and the patterns of FIG. 11E, so that the reference data patterns 26 having the correction patterns E31S, E32S reduced at the angular part of the original patterns E30 are formed, as shown in FIG. 11F.

Figure 11F:
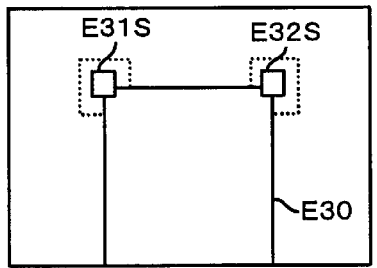

As the reference data patterns 26 of FIG. 11F are patterns analogous to the plate patterns 24 shown in FIG. 10, as shown in FIG. 10, when the patterns 26 are compared with the plate patterns 24 on the reticle in the pattern inspection process S28, the pseudo defects attributable to the correction patterns E31S, E32S will not be detected.

Incidentally, in the case where the device patterns 30 formed on the wafer substrate are inspected, it is preferable that the data patterns of FIG. 11D are utilized as the reference data patterns to decrease the pseudo defects.

Figure 12:
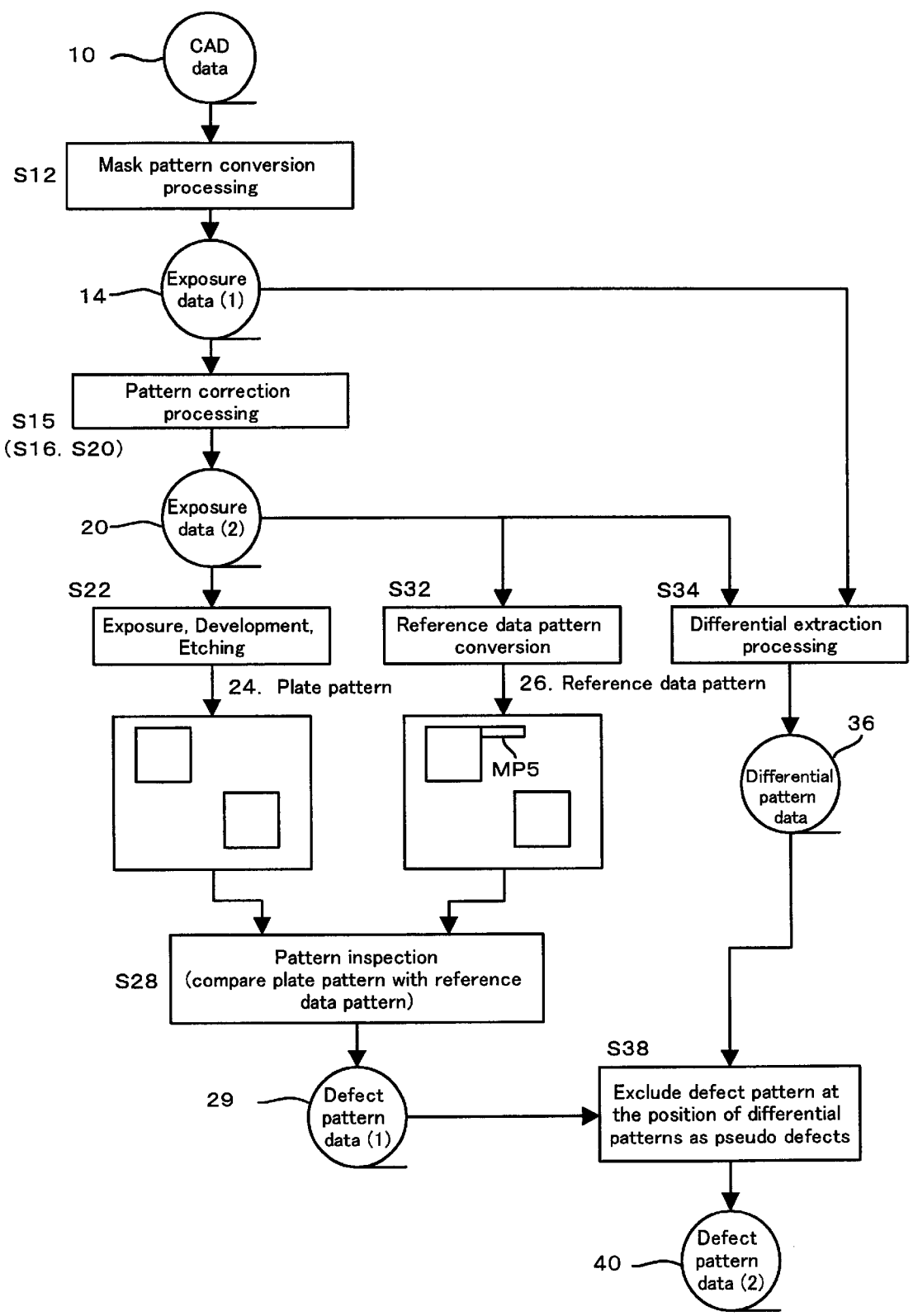
FIG. 12 is a flowchart showing a method of inspecting the plate patterns according to a fourth embodiment.

FIG. 12 is a flowchart showing a method of inspecting plate patterns according to a fourth embodiment. According to the fourth embodiment, a differential extraction process S34 is performed to extract a difference between the first exposure data 14 acquired by format converting the CAD data 10 and the second exposure data 20 acquired by further performing the pattern correction processing S15, whereby the generated differential patterns data 36 are utilized to remove the pseudo defects. Specifically, the differential patterns data 36 contain positional data of the difference between the first and second exposure data 14 and 20. It is judged that the defective patterns are positions of the differential patterns, which are judged to be pseudo defects, are excluded from defect pattern data 29 detected by the pattern inspection S28 (S38). The excluded second defective patterns data 40 are treated as the pattern inspection results.

Various processes are considered for the pattern correction process S15. For example, they are processes of both the slit removal process S16 and fine patterns removal process S20 shown in the first embodiment of FIG. 2. The fine slits causing the pseudo defects are removed by the slit removal process S16, and the fine patterns newly generated and causing the pseudo defects are removed by the fine patterns removal process S20. However, there is a possibility that the fine patterns causing the pseudo defects are generated by the two processes according to combinations of a plurality of patterns.

Such fine patterns are not formed in the plate patterns 24 formed by the exposure, development, and etching. On the other hand, in the reference data patterns 26 acquired by conversion from the second exposure data 20, fine patterns MP5 generated due to some reason are left behind. Accordingly, the pattern inspection process S28 compares such reference data patterns 26 with the plate patterns 24, and the defective patterns detected by the patterns inspection process S28 include the pseudo defects attributable to the fine patterns MP5.

Then, a differential extraction is performed between the first exposure data 14 before the pattern correction process and the second exposure data 20 after the pattern correction process, and by utilizing the positional data of the differential patterns, the pseudo defects are excluded from the first defective patterns data 29. The extracted differential patterns contain the fine slits and fine patterns which are removed by the pattern correction process S15 as well as the fine slits and fine patterns newly generated by the pattern correction process S15.

The pseudo defects attributable to the former patterns are not detected in the patterns inspection process S28. Because as the former patterns are not included in the second exposure data 20, they are not either included in the reference data patterns 26, and the reference data patterns 26 matches with the plate patterns 24.

On the other hand, the pseudo defects attributable to the latter patterns are detected in the pattern inspection process S28. However, as a position of the fine patterns attributable to the pseudo defects is included in the differential patterns data 36, it is possible to remove the fine patterns at the position of the differential patterns as the pseudo defects from the defective patterns data 29 detected in the patterns inspection processs 28. Accordingly, many pseudo defects are excluded in the second defective patterns data 40, and a number of analysis steps of the defective patterns data 40 can be fairly decreased.

A patterns correction process S15 of FIG. 12 may contain only a slit removal process S16. Alternatively, it may contain only a fine patterns removal process S20. In other words, even if some process is performed to remove patterns acting as a cause of the pseudo defects which are previously found, and as a result, the other unexpected patterns causing the pseudo defects are generated secondarily, it is possible to decrease such the pseudo defects from defective patterns data 29 by utilizing the differential patterns data 36 of FIG. 12.

As set forth hereinbefore, according to the present invention, as the reference data patterns are close to the actual plate patterns as much as possible, it is possible to decrease a detection amount of the pseudo defects in the plate patterns inspection. As a result, it is possible to decrease the number of steps of the plate pattern inspection.

Furthermore, according to the present invention, even if the pseudo defects are detected in the plate patterns inspection process, it is possible to exclude the pseudo defects from the inspection results by utilizing the positional data of the patterns causing the pseudo defects. As a result, it is possible to decrease the number of steps of the plate pattern inspection.

The scope of protection of the present invention is not limited to the above embodiments but covers the invention defined in the appended claims and its equivalents.

What is claimed is:

1. A method of inspecting plate patterns which are formed by exposure using exposure data patterns having a plurality of patterns, the method comprising:
   a fine pattern removal process forming reference data patterns by performing on a plurality of patterns included in the exposure data patterns:
      a logical sum process changing a plurality of overlapped patterns into a single pattern;
      a minus-sizing process fining a side of said patterns in a first width; and
      a plus-sizing process thickening the side of said patterns in the first width; and
   a pattern inspection process comparing said plate patterns with said reference data patterns and detecting disagreement between both said plate and reference data patterns as defective patterns.

2. A method of inspecting plate patterns according to claim 1, wherein
   said first width is smaller than a resolution limit value in forming said plate patterns.

3. A method of forming plate patterns which are formed by exposure using exposure data patterns having a plurality of patterns, the method comprising:
   a fine slit removal process generating second exposure data patterns by, with respect to a plurality of patterns included in initial exposure data patterns, performing:
      a plus-sizing process thickening a side of patterns in a first width;
      a logical sum process changing a plurality of overlapped patterns into a sole pattern; and
      a minus-sizing process fining the side of the patterns which are subject to the logical sum process in the first width;
   a fine pattern removal process of generating third exposure data patterns by, with respect to the plurality of patterns included in the second exposure data patterns performing:
      a minus-sizing process fining a side of the patterns in a second width; and
      a plus-sizing process thickening the side of the patterns in the second width;
   plate pattern formation forming said plate patterns according to the second or third exposure data patterns; and
   pattern inspection comparing the plate patterns with the third exposure data patterns, and detecting disagreement between both said plate and third exposure data patterns as defective patterns.

4. A method of forming plate patterns according to claim 3, wherein
   the first width and second width are smaller than a resolution limit value in forming said plate patterns.

5. A method of forming plate patterns which are formed by exposure using exposure data patterns having a plurality of patterns, the method comprising:
   an exposure data generating procedure generating initial exposure data patterns to which correction patterns corresponding to pattern transformation in the exposure and development steps are added;
   a plate pattern forming procedure forming the plate patterns by exposure according to the exposure data patterns to which the correction patterns are added;
   a fine pattern removal process generating reference data patterns by executing, with respect to a plurality of patterns included in the initial exposure data patterns:
      a logical sum process changing a plurality of overlapped patterns into a single pattern;
      a minus-sizing process fining a side of the patterns in the first width; and
      a plus-sizing process thickening the side of the patterns in the first width; and
   a pattern inspection procedure comparing the plate patterns with the reference data patterns, and detecting disagreement of both the plate and the reference data patterns as defective patterns.

6. A method of forming plate patterns according to claim 5, wherein said first width is smaller than a resolution limit value in forming said plate patterns, and is larger than the correction patterns width.

7. A method of forming plate patterns which are formed by exposure using exposure data patterns having a plurality of patterns, the method comprising:
   an exposure data generating procedure generating initial exposure data patterns to which correction patterns corresponding to pattern transformation in the exposure and development operations are added;
   a plate patterns forming procedure forming the plate patterns by exposure according to the exposure data patterns to which the correction patterns are added;
   a correction patterns reduction process generating reference data patterns by reducing a size of the added correction patterns with respect to the plurality of patterns included in the initial exposure data patterns; and a pattern inspection process comparing the plate patterns with the reference data patterns, and detecting disagreement of both the patterns as defective patterns.

8. A method of forming plate patterns according to claim 7, wherein the correction patterns reduction process comprises:
    a first process generating first intermediate patterns by, with respect to a plurality of patterns included in initial exposure data patterns, executing:
        a logical sum process changing a plurality of overlapped patterns into a single pattern;
        a minus-sizing process fining a side of the patterns in the first width; and
        a plus-sizing process thickening the side of the patterns in the first width;
    a second process generating second intermediate patterns by executing:
        a minus-sizing process fining the plurality of patterns included in the first exposure data patterns in a second width smaller than the first width; and
        a plus-sizing process thickening a side of the patterns in the second width; and
    a third process performing a logical sum process of the first intermediate patterns and second intermediate patterns to form the reference data patterns.

9. A method of forming plate patterns according to claim 8, wherein the first width is smaller than a resolution limit value in forming the plate patterns, and is larger than the correction patterns, and the second width is smaller than the correction patterns.

10. A method of forming plate patterns which are formed by exposure using exposure data patterns having a plurality of patterns, the method comprising:
    a correction patterns process correcting a plurality of patterns included in initial exposure data patterns in corresponding to patterns transformation in the exposure step to generate second exposure data patterns;
    a plate patterns formation process forming the plate patterns in accordance with the second exposure data patterns;
    a plate patterns inspection process comparing the plate patterns with the second exposure data patterns as a reference patterns to detect disagreement of both the patterns as defective patterns;
    a differential extraction process extracting differential patterns between the initial exposure data patterns and the second exposure data patterns; and
    a defective data amendment process removing, as pseudo defective data, data at a position of the differential patterns extracted in the differential extraction process from defective data detected by the plate patterns inspection procedure.

11. A method of forming plate patterns according to claim 1, wherein the plate patterns are any ones of patterns formed on a reticle, patterns formed on a semiconductor wafer, and patterns formed on an exposing mask.

12. A method of inspecting plate patterns which are formed by exposure using exposure data patterns having a plurality of patterns, the method comprising:
    forming reference data patterns by performing on a plurality of patterns included in the exposure data patterns the following operations:
        changing a plurality of overlapped patterns into a single pattern;
        fining a side of said patterns in a first width; and
        thickening the side of said patterns in the first width; and
    comparing said plate patterns with said reference data patterns and detecting disagreement between both said plate and reference data patterns as defective patterns.

13. A method of inspecting plate patterns according to claim 12, wherein said first width is smaller than a resolution limit value in forming said plate patterns.

14. A method of forming plate patterns which are formed by exposure using exposure data patterns having a plurality of patterns, the method comprising:
    generating second exposure data patterns by, with respect to a plurality of patterns included in initial exposure data patterns, performing the operations of:
        thickening a side of patterns in a first width;
        changing a plurality of overlapped patterns into a sole pattern; and
        fining the side of the patterns which are subject to the logical sum process in the first width;
    generating third exposure data patterns by, with respect to the plurality of patterns included in the second exposure data patterns, performing the operations of:
        fining a side of the patterns in a second width; and
        thickening the side of the patterns in the second width;
    forming said plate patterns according to the second or third exposure data patterns; and
    comparing the plate patterns with the third exposure data patterns, and detecting disagreement between both said plate and third exposure data patterns as defective patterns.

15. A method of forming plate patterns according to claim 14, wherein the first width and second width are smaller than a resolution limit value in forming said plate patterns.

16. A method of forming plate patterns which are formed by exposure using exposure data patterns having a plurality of patterns, the method comprising:
    generating initial exposure data patterns to which correction patterns corresponding to pattern transformation in the exposure and development steps are added;
    forming the plate patterns by exposure according to the exposure data patterns to which the correction patterns are added;
    generating reference data patterns by executing, with respect to a plurality of patterns included in the initial exposure data patterns, the operations of:
        changing a plurality of overlapped patterns into a single pattern;
        fining a side of the patterns in the first width; and
        thickening the side of the patterns in the first width; and
    comparing the plate patterns with the reference data patterns, and detecting disagreement of both the plate and the reference data patterns as defective patterns.

17. A method of forming plate patterns according to claim 16, wherein said first width is smaller than a resolution limit value in forming said plate patterns, and is larger than the correction patterns width.

18. A method of forming plate patterns which are formed by exposure using exposure data patterns having a plurality of patterns, the method comprising:
    generating initial exposure data patterns to which correction patterns corresponding to pattern transformation in the exposure and development operations are added;
    forming the plate patterns by exposure according to the exposure data patterns to which the correction patterns are added;
    generating reference data patterns by reducing a size of the added correction patterns with respect to the plurality of patterns included in the initial exposure data patterns; and comparing the plate patterns with the reference data patterns, and detecting disagreement of both the patterns as defective patterns.

19. A method of forming plate patterns according to claim 18, wherein the correction patterns reduction comprises:

generating first intermediate patterns by, with respect to a plurality of patterns included in initial exposure data patterns, the operations of:
    changing a plurality of overlapped patterns into a single pattern;
    fining a side of the patterns in the first width; and
    thickening the side of the patterns in the first width;
    generating second intermediate patterns by the operations of:
    fining the plurality of patterns included in the first exposure data patterns in a second width smaller than the first width; and
    thickening a side of the patterns in the second width; and performing a logical sum process of the first intermediate patterns and second intermediate patterns to form the reference data patterns.

20. A method of forming plate patterns according to claim 19, wherein the first width is smaller than a resolution limit value in forming the plate patterns, and is larger than the correction patterns, and the second width is smaller than the correction patterns.

21. A method of forming plate patterns which are formed by exposure using exposure data patterns having a plurality of patterns, the method comprising:

correcting a plurality of patterns included in initial exposure data patterns in corresponding to patterns transformation in the exposure step to generate second exposure data patterns;

forming the plate patterns in accordance with the second exposure data patterns;

comparing the plate patterns with the second exposure data patterns as a reference patterns to detect disagreement of both the patterns as defective patterns;

extracting differential patterns between the initial exposure data patterns and the second exposure data patterns; and removing, as pseudo defective data, data at a position of the differential patterns extracted in the differential extraction process from defective data detected by the plate patterns inspection procedure.

* * * * *